(12) United States Patent
Kanazawa (10) Patent No.: US 7,486,379 B2
(45) Date of Patent: Feb. 3, 2009

(54) EXPOSURE APPARATUS, METHOD APPLIED TO THE APPARATUS, AND DEVICE MANUFACTURING METHOD

(75) Inventor: Kenichi Kanazawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 282 days.

(21) Appl. No.: 11/398,586

(22) Filed: Apr. 6, 2006

(65) Prior Publication Data

US 2006/0238734 A1    Oct. 26, 2006

(30) Foreign Application Priority Data

Apr. 20, 2005    (JP)    ............................ 2005-122946

(51) Int. Cl.
    *G03B 27/42*    (2006.01)
(52) U.S. Cl. .......................................... 355/53; 355/77
(58) Field of Classification Search .................. 355/53, 355/69
    See application file for complete search history.

(56) References Cited

U.S. PATENT DOCUMENTS

| 4,841,132 | A | 6/1989 | Kajitani et al. ............... 235/472 |
| 6,115,107 | A * | 9/2000 | Nishi ........................... 355/68 |
| 2005/0146693 | A1* | 7/2005 | Ohsaki ......................... 355/30 |
| 2006/0001856 | A1* | 1/2006 | Moors et al. .................. 355/69 |
| 2006/0082744 | A1 | 4/2006 | Hirukawa ..................... 355/30 |
| 2006/0098179 | A1 | 5/2006 | Hirukawa ..................... 355/53 |

FOREIGN PATENT DOCUMENTS

| JP | 63-49893 | 3/1988 |
| JP | 2005-12201 | 1/2005 |

OTHER PUBLICATIONS

Korean Office Action dated Aug. 17, 2007, issued in corresponding Korean patent application No. 10-2006-0035669.

* cited by examiner

*Primary Examiner*—Diane I Lee
*Assistant Examiner*—Steven H Whitesell-Gordon
(74) *Attorney, Agent, or Firm*—Fitzpatrick, Cella, Harper & Scinto (57) ABSTRACT

An exposure apparatus for exposing a substrate to light via an original plate. A projection optical system projects a pattern of the original plate onto the substrate, a liquid immersion mechanism generates a liquid immersion state in which a gap between the final surface of the projection optical system and the substrate is filled with liquid, a first photosensor detects light which has passed through the projection optical system, a second photosensor, different from the first photosensor, detects light that has passed through the projection optical system, and a controller calibrates an output from the first photosensor in the liquid immersion state based on a first output from the first photosensor in the liquid immersion state, a second output from the first photosensor in a non-liquid immersion state, and a third output from a reference illuminometer.

15 Claims, 10 Drawing Sheets

ANGULAR CHARACTERISTIC OF INTERNAL ILLUMINOMETER

EXPOSURE APPARATUS, METHOD APPLIED TO THE APPARATUS, AND DEVICE MANUFACTURING METHOD

This application claims the benefit of Japanese Patent Application No. 2005-122946, filed Apr. 20, 2005, which is hereby incorporated by reference herein in its entirety.

FIELD OF THE INVENTION

The present invention relates to, for example, an exposure technique used in lithography processes of manufacturing a device, such as a semiconductor device, such as an IC or LSI, a liquid crystal device, an image sensing device, such as a CCD, or a magnetic head and, more particularly, to a technique associated with control or adjustment of the exposure amount.

BACKGROUND OF THE INVENTION

As micronization of a semiconductor element advances, the type of a light source used for a semiconductor exposure apparatus is being shifted from the g-line of a high-pressure mercury-vapor lamp to an i-line having a shorter wavelength and a laser beam source (KrF or ArF), called an excimer laser, which emits light having a much shorter wavelength. In recent years, the use of an X-ray beam is also proposed. Moreover, realizing higher resolving power and larger depth using a phase shift mask or a modified illumination has been proposed and even begun to be practiced. However, the method using the excimer laser or X-ray beam increases the cost of the apparatus, and the phase shift mask or modified illumination is not effective for some circuit patterns.

On the other hand, increasing the NA (numerical aperture) of a projection lens makes it possible to realize a higher resolving power.

To cope with this trend, the practical application of a liquid immersion method of supplying a liquid between the projection lens and the imaging plane to increase its NA using the refraction effect is being attempted. For example, Japanese Patent Publication No. 63-49893 discloses a liquid immersion projection exposure apparatus, which forms a nozzle having a liquid supply port, so as to surround the distal end of a reduction lens, supplies a liquid via the nozzle, and holds the liquid between the reduction lens and the wafer.

As for exposure amount control, to measure a light amount intensity difference between apparatuses and to guarantee an equivalent exposure amount among a plurality of apparatuses, an illuminometer (external illuminometer) is externally loaded in the apparatus and an exposure amount sensor (internal illuminometer) in the apparatus is calibrated. Furthermore, to convert a value output from the internal illuminometer into an absolute light amount value, the internal illuminometer must be calibrated by an absolute light amount sensor. In fact, it is inefficient to separately execute absolute light amount calibration and calibration between the apparatuses. Therefore, these two calibrations are executed using the same absolute light amount sensor as the external illuminometer.

In the above conventional liquid immersion projection exposure apparatus, the transmittance of an excimer laser beam changes between a dried state and a liquid immersion state. In the dried state, the space between the reduction lens and the wafer is filled with a gas, such as air. In the liquid immersion state, the space between the reduction lens and the wafer is filled with a liquid to attain micropatterning. As a result, the illuminance of the imaging plane changes between these states. Furthermore, when the external illuminometer is set in the liquid immersion state, downtime is prolonged due to illuminance measurement and close attention must be paid to prevent the liquid from leaking outside a region where liquid immersion is possible, resulting in poor working efficiency. This makes it difficult to assure a good exposure amount control performance in the liquid immersion state, as with the conventional dried state.

SUMMARY OF THE INVENTION

The present invention has been made in consideration of the above backgrounds, and has as its exemplary object to provide a novel technique for calibrating an output from a photosensor associated with exposure amount control.

In order to solve the above problems and to achieve the above object, according to a first aspect of the present invention, there is provided an exposure apparatus for exposing a substrate to light via an original plate, comprising a projection optical system configured to project a pattern of the original plate onto the substrate, a liquid immersion mechanism configured to generate a liquid immersion state in which a gap between the projection optical system and the substrate is filled with liquid, a first photosensor configured to detect light which has passed through the projection optical system, and a controller configured to calibrate an output from the first photosensor in the liquid immersion state, based on a first output from the first photosensor in the liquid immersion state, a second output from the first photosensor in a non-liquid immersion state, and a third output from a reference illuminometer for detecting light which has passed through the projection optical system in the non-liquid immersion state.

According to a second aspect of the present invention, there is provided an exposure apparatus for exposing a substrate to light via an original plate, the apparatus comprising a projection optical system configured to project a pattern of the original plate onto the substrate, a liquid immersion mechanism configured to generate a liquid immersion state in which a gap between the projection optical system and the substrate is filled with liquid, a first photosensor configured to detect light which has passed through the projection optical system, and a controller configured to calibrate an output from the first photosensor in the liquid immersion state based on a first output from the first photosensor in one of the liquid immersion state and a non-liquid immersion state, a second output from a reference illuminometer for detecting light which has passed through the projection optical system in the non-liquid immersion state, and information of a transmittance of the liquid measured in advance.

According to a third aspect of the present invention, there is provided a method applied to an exposure apparatus for exposing a substrate to light via an original plate, the apparatus including a projection optical system configured to project a pattern of the original plate onto the substrate, a liquid immersion mechanism configured to generate a liquid immersion state in which a gap between the projection optical system and the substrate is filled with liquid, and a first photosensor configured to detect light which has passed through the projection optical system, the method comprising steps of obtaining a first output from the first photosensor in the liquid immersion state, obtaining a second output from the first photosensor, obtaining a third output from a reference illuminometer for detecting light which has passed through the projection optical system in a non-liquid immersion state, and calibrating an output from the first photosensor in the liquid immersion state based on the first to third outputs.

According to a fourth aspect of the present invention, there is provided a method applied to an exposure apparatus for exposing a substrate to light via an original plate, the apparatus including a projection optical system configured to project a pattern of the original plate onto the substrate, a liquid immersion mechanism configured to generate a liquid immersion state in which a gap between the projection optical system and the substrate is filled with liquid, and a first photosensor configured to detect light which has passed through the projection optical system, the method comprising steps of obtaining a first output from the first photosensor in one of the liquid immersion state and a non-liquid immersion state, obtaining a second output from a reference illuminometer for detecting light which has passed through the projection optical system in the non-liquid immersion state, and calibrating an output from the first photosensor in the liquid immersion state based on the first and second outputs, and information of a transmittance of the liquid.

Also, according to a fifth aspect of the present invention, a method of manufacturing a device comprises steps of exposing a substrate to light via an original plate using an exposure apparatus as discussed above, developing the exposed substrate, and processing the developed substrate to manufacture the device.

The present invention can provide, e.g., a novel technique for calibrating an output from a photosensor associated with exposure amount control.

Other objects and advantages besides those discussed above shall be apparent to those skilled in the art from the description of a preferred embodiment of the invention as follows. In the description, reference is made to the accompanying drawings, which form a part thereof, and which illustrate an example of the invention. Such an example, however, is not exhaustive of the various embodiments of the invention, and, therefore, reference is made to the claims which follow the description for determining the scope of the invention.

DETAILED DESCRIPTION OF THE PREFERRED EMBODIMENTS

Embodiments according to the present invention will be described below in detail with reference to the accompanying drawings.

Note that the embodiments to be described hereinafter are examples as implementing means of the present invention, and can be appropriately modified or changed in accordance with various conditions and the arrangement of an apparatus to which the present invention is applied.

First Embodiment

Figure 1:
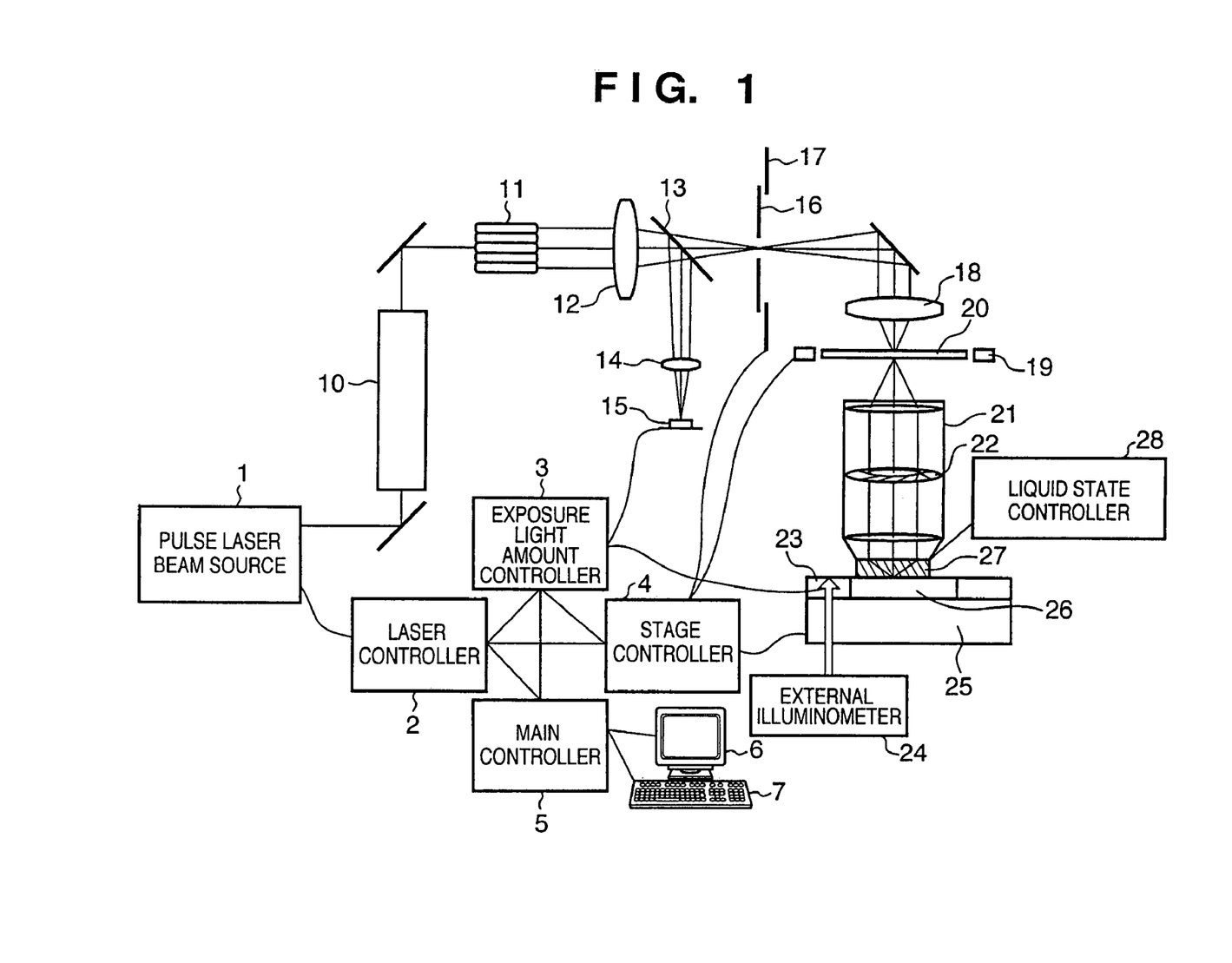
FIG. 1 is a schematic view showing the main part of a liquid immersion exposure apparatus according to the first embodiment of the present invention.

FIG. 1 is a schematic view showing the main part of a liquid immersion exposure apparatus according to the first embodiment of the present invention.

The liquid immersion exposure apparatus according to this embodiment is a scanning exposure apparatus which irradiates, with a light beam emitted from a pulse laser light source, an original plate (reticle) through an illumination optical system (illumination means), reduces and projects a circuit pattern formed on the reticle, and prints it, through a projection lens (projection optical system), onto a wafer (substrate) coated with a photosensitive material, while scanning the reticle and wafer. This apparatus is preferable in manufacturing a device, such as a semiconductor device, such as an IC or LSI, an image sensing device, such as a CCD, or a magnetic head.

In FIG. 1, a pulse laser light source (light source means) 1, such as an excimer laser, emits pulse light. A beam shaping unit 10 fixes the light beam from the laser light source 1 into a predetermined illumination shape and applies it to the incident surface of a fly-eye lens 11. The fly-eye lens 11 comprises a plurality of microlenses and forms a plurality of secondary sources near its exit surface. A condenser lens 12 Koehler-illuminates an exposure slit 16 and a movable slit (masking blade) 17 with the light beam from the secondary source near the light exit surface of the fly-eye lens 11.

The light beam having illuminated the movable slit 17 illuminates a reticle 20 through a collimator lens 18. The movable slit 17 is optically conjugate to the reticle 20. This positional relationship allows the opening shape of the movable slit 17 to define the shape and dimensions of the illumination region of the reticle 20. The movable slit 17 includes, e.g., a voice coil motor (not shown) to move it in the direction of the optical axis. A light exposure integrator (light exposure integrating meter) 15 causes a collective lens (condenser lens) 14 to partially focus the pulse-like illumination light separated by a half mirror 13 to detect the light amount, thereby outputting the detection signal to an light exposure controller 3.

The beam shaping unit 10, fly eye lens 11, condenser lens 12, exposure slit 16, movable slit 17, and collimator lens 18 constitute one component of an illumination means (exposure light providing means) for providing exposure light to the reticle 20. A beam attenuation means (not shown) is provided in the illumination means to adjust the amount of the light beam from the laser light source 1 with multiple steps. The reticle 20 has a circuit pattern thereon, and is held by a reticle stage 19. A projection lens (projection optical system) 21 reduces the circuit pattern of the reticle 20 and projects it onto a wafer 26. The surface of the wafer 26 is coated with a resist as a photosensitive agent. The wafer 26 is placed on a wafer stage 25, which is three-dimensionally displaced and aligned at an arbitrary position. The surface of the wafer 26 is located at a position conjugate to the movable slit 17.

An internal illuminometer 23 is formed on the wafer stage 25 and measures the amount of pulse light through the projection lens 21, as will be described later.

Since the light exposure integrator 15 can measure the light amount intensity even during exposure, it is used to estimate the integrated value of the exposure light emitted from the exposure slit 16. The internal illuminometer 23 is used to measure the intensity of the pulse light (in the image plane of the projection lens 21), which is transmitted through the projection lens 21 in the first stage of the exposure process and applied to the wafer 26.

A stage driving controller (scanning means) 4 controls operation to move the reticle stage 19 and wafer stage 25 in directions reverse to each other at an exactly constant velocity, having the same ratio as that of the imaging magnification used by the projection lens (projection optical system) 21. The light exposure controller 3 converts an electrical signal, which is photoelectrically converted by the light exposure integrator 15, into a logical value and outputs it to a main controller 5. The output value is stored in a storage means in the main controller 5.

The correlation between the measurement value (light intensity) obtained by the internal illuminometer 23 and the measurement value obtained by the light exposure integrator 15 is calculated in advance. In each exposure, the measurement value of the light exposure integrator 15 is corrected using the obtained correlation to calculate the exposure amount on the wafer. The internal illuminometer 23 does not measure the exposure light intensity during wafer exposure.

A laser controller 2 outputs a trigger signal and charge voltage signal in accordance with a desired exposure amount to control the pulse energy and light-emitting interval of the laser light source 1. When generating the trigger signal and charge voltage signal, the laser controller 2, uses, as parameters, an illuminance monitor signal from the light exposure controller 3, a current stage position signal from the stage controller 4, and use log information from the main controller 5.

The main controller 5 calculates a group of parameters necessary for scanning exposure on the basis of data given by an input device 7, parameters unique to the apparatus, and the measurement data obtained by measurement means, such as the light exposure integrator 15. The main controller 5 transmits these parameters to the laser controller 2, stage controller 4, and beam shaping unit 10.

Under the control of the main controller 5, a liquid state controller (also called a liquid immersion mechanism) 28 supplies a liquid to the gap between the final surface of the projection lens 21 and the exposure target, such as the substrate 26 or internal illuminometer 23, and recovers the liquid from the gap, thereby filling the gap with the liquid (setting a liquid immersion state).

To calibrate the internal illuminometer 23, absolute value calibration and calibration between apparatuses according to this embodiment are executed using an external illuminometer (reference illuminometer) 24, which serves as a tool that is loaded from the outside of the apparatus and can be arranged on the imaging plane.

Even when absolute value calibration and calibration between the apparatuses are executed in a normal state in illuminometer calibration, they must be done periodically in accordance with factors such as a temporal change and a deterioration depending on the number of detected integrated pulses. Absolute value calibration and calibration between the apparatuses are executed for a reference internal illuminometer out of a plurality of internal illuminometers 23 formed on the wafer stage 25. The reference internal illuminometer formed on the wafer stage 25 desirably has the same angular characteristic, which causes an output variation depending on an incident angle, as that of the external illuminometer 24. The reference internal illuminometer further desirably has the same sensitivity characteristic which causes an output variation depending on the amount of received light. To the contrary, if the reference internal illuminometer and the external illuminometer 24 have different angular characteristics and sensitivity characteristics, the sensitivity of the internal illuminometer 23 may be separately calibrated for each condition, i.e., a case in which the NA of the projection lens or the exposure amount changes between them, thus compensating for the sensitivity of the internal illuminometer 23 in accordance with the conditions of the exposure amount and the NA value of the projection lens (which can be changed by an NA stop 22), which are to be changed.

A method of absolute value calibration and calibration between the apparatuses will be described next.

To execute absolute value calibration and calibration between the apparatuses, measurement values LID, ILD, LII, ILI, LIA, and ILA are measured. The measurement values LID and ILD are obtained by the light exposure integrator 15 and the reference internal illuminometer, respectively, in a dried state. The measurement values LII and ILI are obtained by the light exposure integrator 15 and the reference internal illuminometer, respectively, in a liquid immersion state. The measurement values LIA and ILA are obtained by the light exposure integrator 15 and external illuminometer 24, respectively, in the dried state. A calibration coefficient D of the light exposure integrator 15 in liquid immersion is calculated on the basis of the above values. The calibration coefficient D is calculated by:

$$D=((ILI/LII)/(ILD/LID))*(ILA/LIA).$$

Since the calibration coefficient of the light exposure integrator 15 is calculated by this equation, a coefficient of the reference internal illuminometer can also be calculated on the basis of the relationship between the measurement values of the light exposure integrator 15 and the reference internal illuminometer.

The flow of the process of calculating the calibration coefficient D for absolute value calibration and calibration between the apparatuses will be described next with reference to FIG. 2. Calculation and control of the process can be executed by, e.g., the main controller 5.

Figure 2:
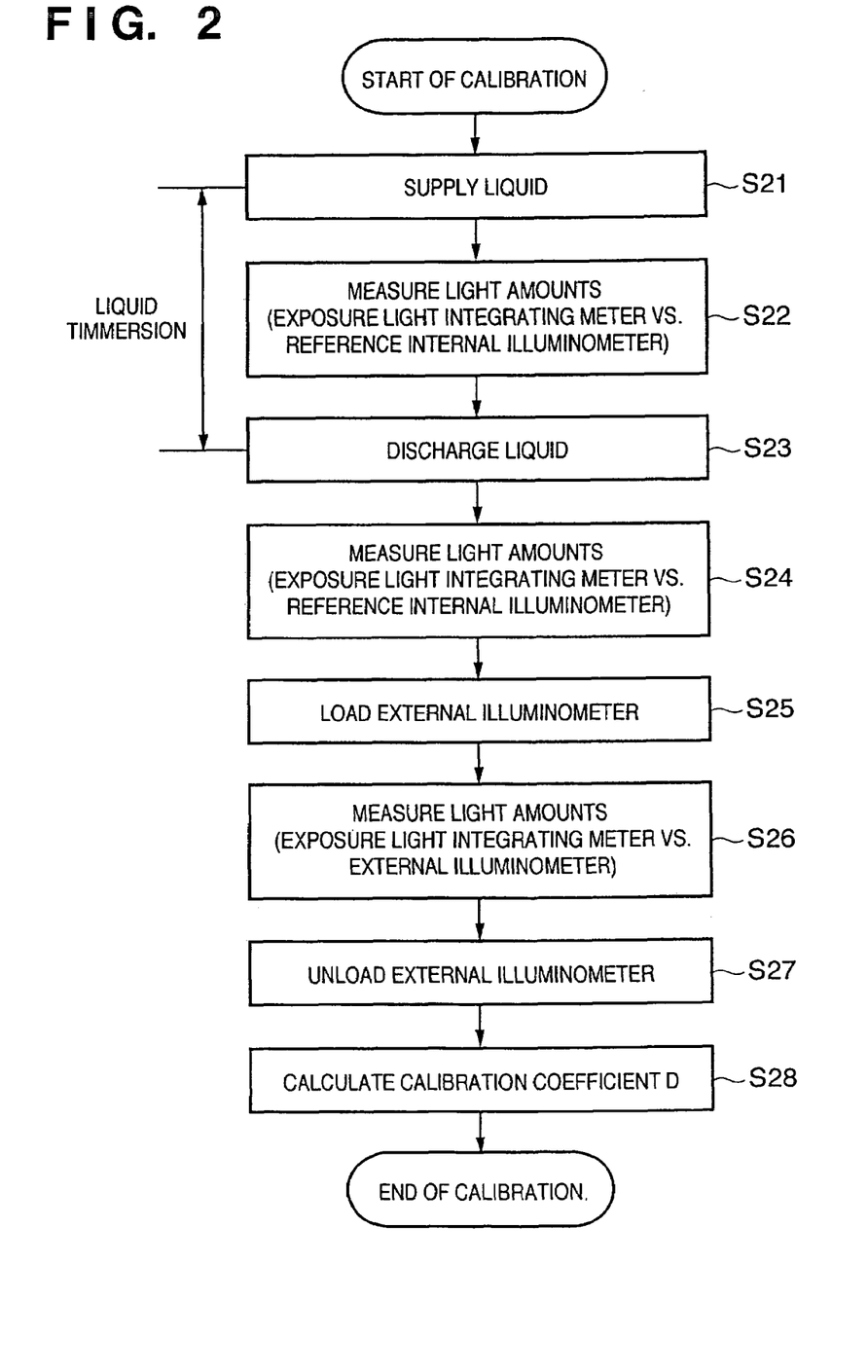
FIG. 2 is a flowchart showing an indirect calibration process of a reference internal illuminometer in the liquid immersion exposure apparatus according to the first embodiment.

Referring to FIG. 2, first, a liquid is supplied (step S21). The value LII of the light exposure integrator 15 and the value ILI of the reference internal illuminometer 23 are measured in a liquid immersion state (step S22). After that, the liquid is discharged (step S23). The value LID of the light exposure integrator 15 and the value ILD of the reference internal illuminometer 23 are measured in a dried state (step S24). The external illuminometer 24 is loaded (step S25). The value LIA of the light exposure integrator 15 and the value ILA of the external illuminometer 24 are measured in the dried state (step S26). The external illuminometer 24 is unloaded (step S27). In this case, the external illuminometer 24 loaded from the outside of the apparatus is not set in a liquid immersion state, so the measurement operation is very efficient. The transmittance of the liquid is then calculated on the basis of the measurement values LID and ILD obtained by the light exposure integrator 15 and the reference internal illuminometer 23, respectively, in the dried state, and LII and ILI obtained by the light exposure integrator 15 and the reference internal illuminometer 23, respectively, in the liquid immersion state. The calibration coefficient D in liquid immersion is calculated by multiplying the calculated liquid transmittance by the ratio of the measurement value LIA of the light exposure integrator 15 to the measurement value ILA of the external illuminometer 24, in the dried state (step S28). The light exposure integrator (or the reference internal illuminometer) can be calibrated according to circumstances on the basis of an output from the light exposure integrator (or the reference internal illuminometer) in liquid immersion or non-liquid immersion, an output from the external illuminometer in non-liquid immersion, and information about the transmittance of the liquid, which is measured and stored in advance.

The data of the transmittance of the liquid, which is obtained by periodical measurement and held in the exposure apparatus, can be used to compensate for a short-term variation in transmittance due to the projection optical system.

Figure 3:
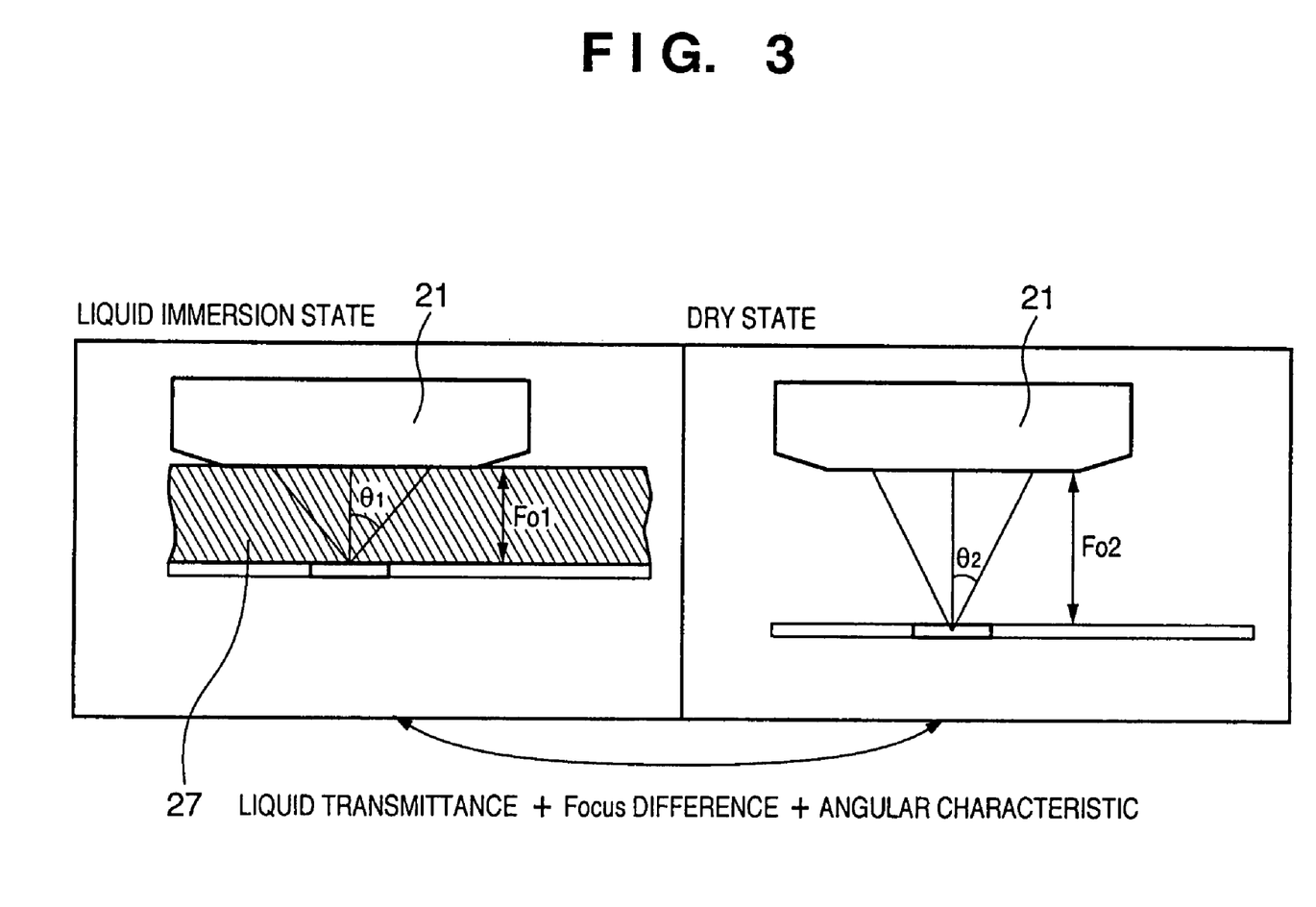
FIG. 3 is a view showing the difference between a liquid immersion state and a dried state in the liquid immersion exposure apparatus according to the embodiment.

However, to execute indirect absolute value calibration (FIG. 2), while the internal illuminometer for use has an angular characteristic, the NA of the projection lens must remain the same for measurement in both the liquid immersion state and dry state (non-liquid immersion state). As shown in FIG. 3, the liquid transmittance, the focus (Fo1, Fo2), and the incident angle ($\theta_1$, $\theta_2$) to the internal illuminometer change between the liquid immersion state and the dry state. The liquid transmittance has already been calculated in step S28 of FIG. 2. As for the incident angle to the internal illuminometer 23, an NA higher than 1.0 attained in liquid immersion is practically impossible in the dried state. Therefore, it is difficult to always keep the same NA of the projection lens in both the states. To solve this problem, if it is difficult to set the same NA of the projection lens in both the states because, e.g., a required NA of the projection lens is larger than a maximum value that is practically attainable in the dried state, angular characteristic data of the light reception sensitivity of the internal illuminometer 23 is held in advance in the exposure apparatus (e.g., a nonvolatile memory of the main controller 5).

Figure 4:
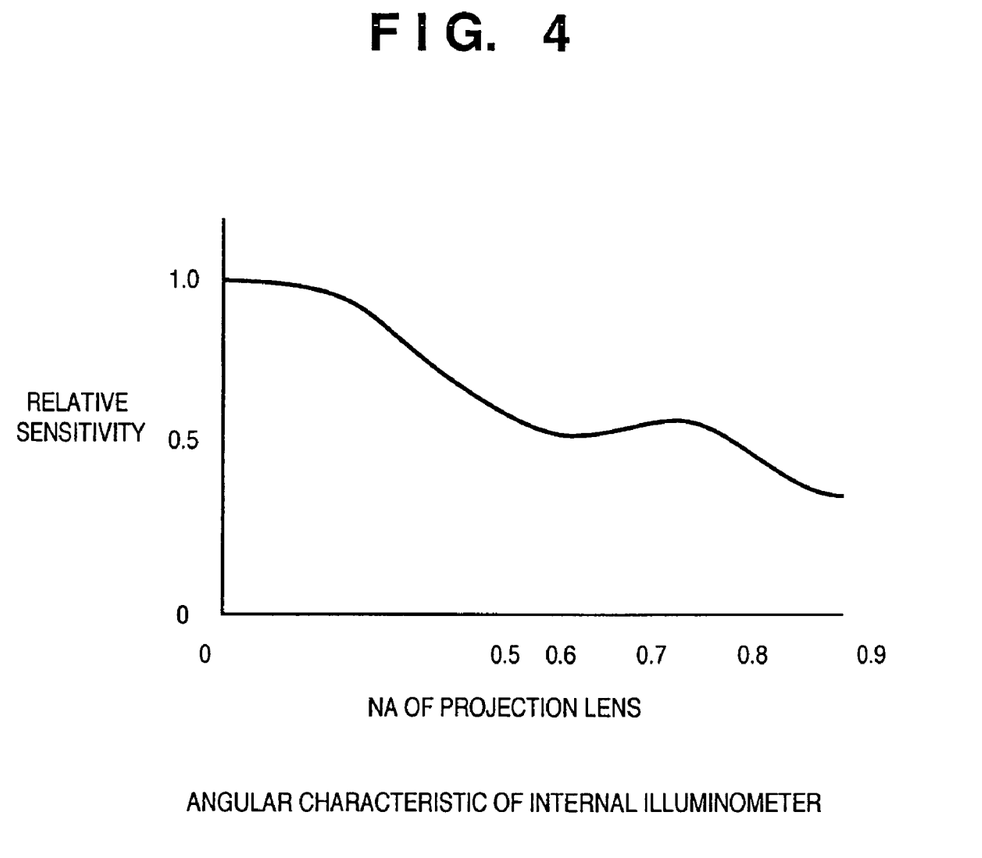
FIG. 4 is a graph showing angular characteristic data of the internal illuminometer in the liquid immersion exposure apparatus according to the embodiment.

FIG. 4 shows an angular characteristic of the internal illuminometer. FIG. 4 is a graph showing the relative ratio of sensitivity which changes depending on the difference in incident angle to the internal illuminometer 23. Using this ratio, the internal illuminometer 23 is calibrated by a method of estimating an actual exposure amount on the basis of the incident angle to the NA of the projection lens and an actual light amount measured by the internal illuminometer 23. Letting f(NA) be a function of the sensitivity ratio to the angle of the NA of the projection lens, an actual illuminance value RILD without any angular characteristic can be expressed using the measurement value ILD of the reference internal illuminometer 23 in the dried state as follows:

$$RILD = f(NA) \times ILD.$$

This calculation can be executed by, e.g., the main controller 5. A calibration method in consideration of deterioration characteristics of a plurality of internal illuminometers will be described next.

Figure 5:
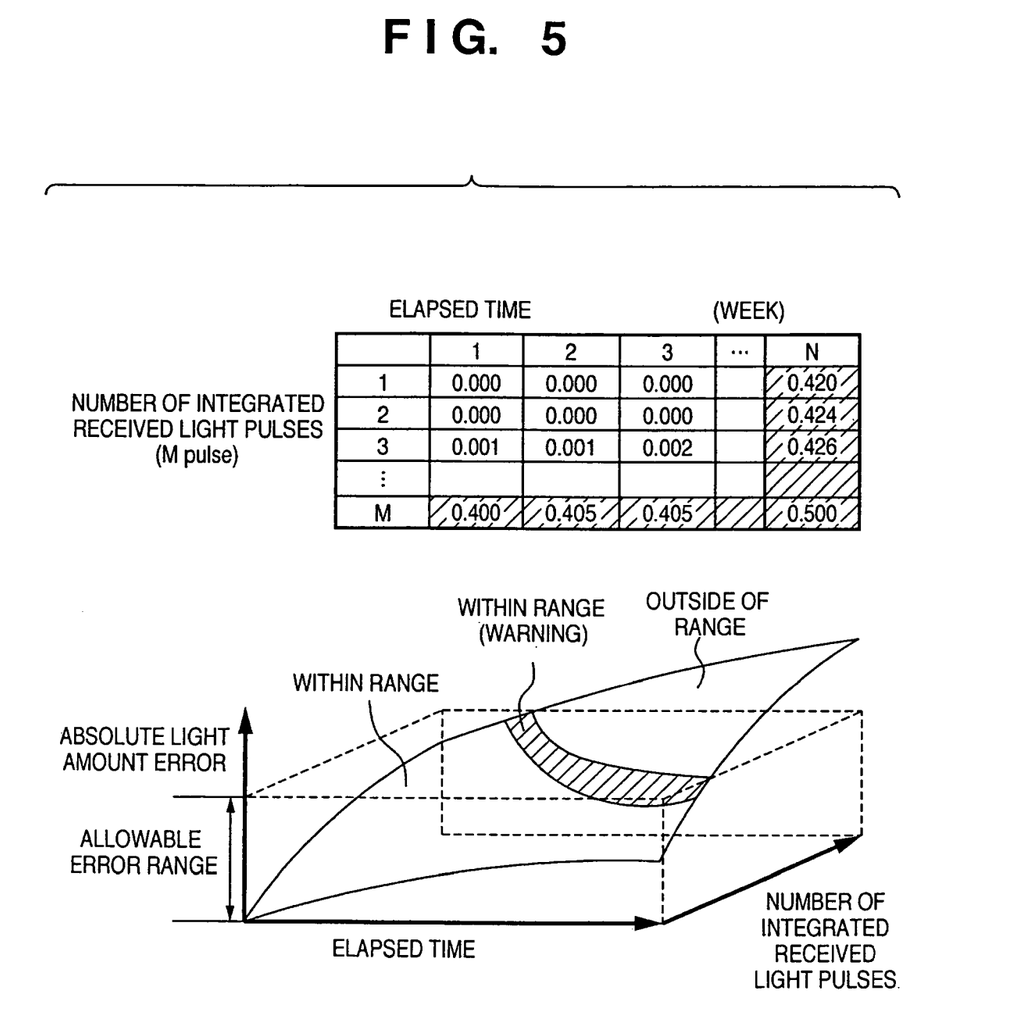
FIG. 5 shows views of absolute light amount error data of the internal illuminometer in the liquid immersion exposure apparatus according to the embodiment.

In such a calibration, accuracy deterioration characteristic data is stored in the apparatus (e.g., the nonvolatile memory of the main controller 5) for each of the plurality of internal illuminometers 23. An example of the accuracy deterioration characteristic data in FIG. 5 shows an empirical independence relationship between the output value of the internal illuminometer 23 and the elapsed time, and the number of integrated light pulses received by the internal illuminometer 23 after preceding absolute value calibration and calibration between the apparatuses. Three states, i.e., "within a range", "within a range (warning)", and "outside of a range" are represented depending on an allowable deterioration value.

Figure 6:
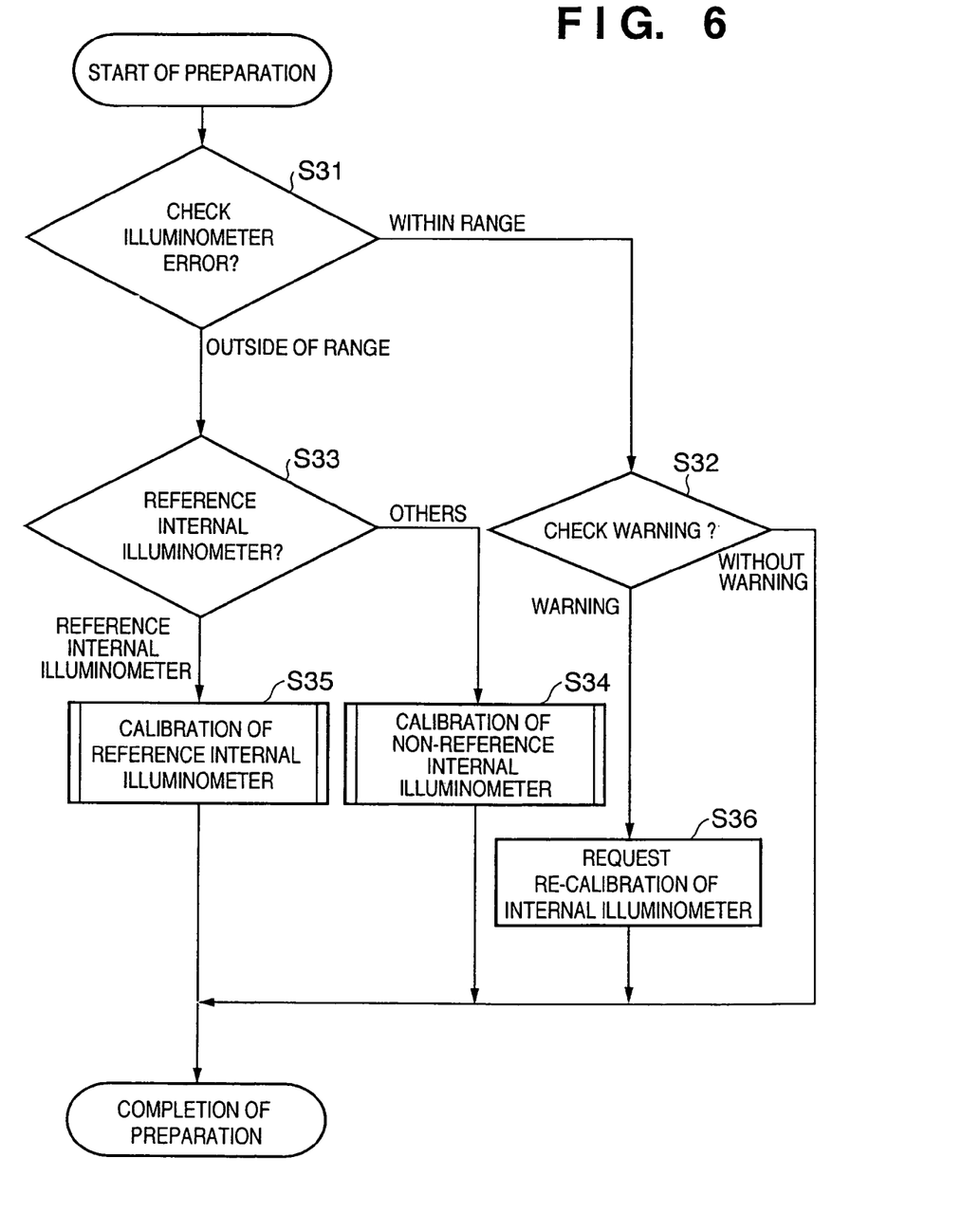
FIG. 6 is a flowchart when the internal illuminometer is prepared for use in the liquid immersion exposure apparatus according to the embodiment.

As shown in FIG. 6, to prepare for measurement using the internal illuminometer 23, whether a deterioration error falls within the allowable value is determined by referring to the accuracy deterioration data (FIG. 5) of the internal illuminometer 23 (step S31). If the accuracy deterioration falls outside the allowable range, the internal illuminometer for use undergoes absolute value calibration and calibration between the apparatuses. At this time, whether the internal illuminometer for use serves as the reference is determined (step S33). If the internal illuminometer for use serves as the reference, calibration in FIG. 2 is executed (step S35).

Figure 7:
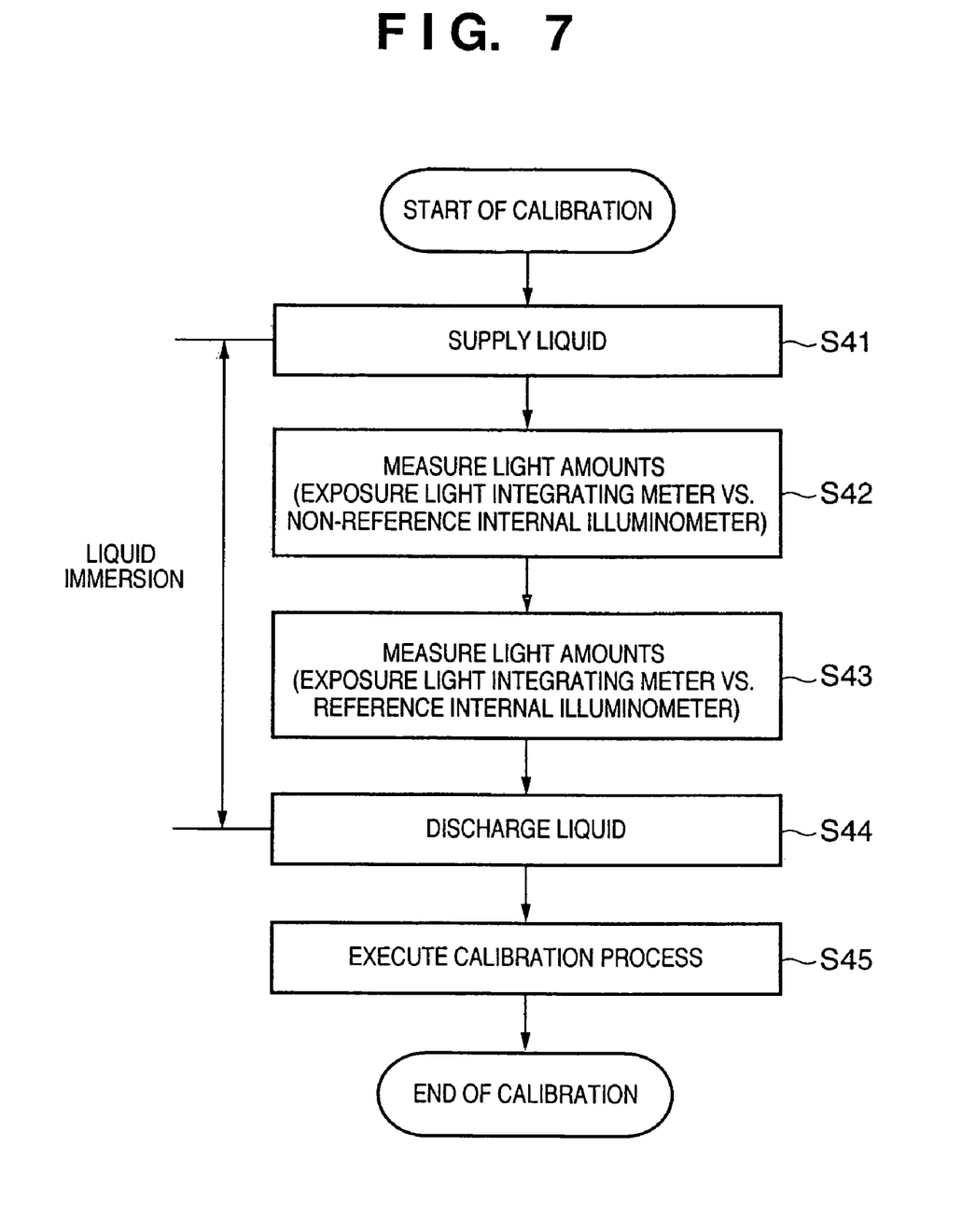
FIG. 7 is a flowchart showing a calibration process by direct measurement of a non-reference internal illuminometer in the liquid immersion exposure apparatus according to the embodiment.

If the internal illuminometer for use does not serve as the reference, indirect calibration in FIG. 7 is executed without using the external illuminometer 24 (step S34).

Moreover, even when the deterioration error falls within the allowable range (step S31), if it exceeds a threshold value for warning (step S32), the user is notified that the internal illuminometer 23 needs to undergo absolute value calibration and calibration between the apparatuses (step S36). Calculation (calculation of the calibration coefficient) and control of the process shown in FIG. 6 can be executed by, e.g., the main controller 5.

FIG. 7 is a flowchart showing the process of calibrating the non-reference internal illuminometer. The calibration (calculation of the calibration coefficient) and control of the process can be executed by, e.g., the main controller 5.

Referring to FIG. 7, after a liquid is supplied (step S41), the light amounts of the light exposure integrator versus non-reference internal illuminometer are measured in a liquid immersion state (step S42). Furthermore, the light amounts of the light exposure integrator vs. the reference internal illuminometer are measured (step S43). After the liquid is discharged (step S44), the measurement value of the non-reference internal illuminometer is calibrated by the measurement value of the reference internal illuminometer (step S45).

According to this embodiment, in calibration of the internal illuminometer 23 in liquid immersion exposure, the external illuminometer 24 is used in a dried state. This makes it possible to shorten a time required to calibrate the internal illuminometer in liquid immersion exposure.

In addition to using the external illuminometer 24 in the dried state, calibrating the plurality of internal illuminometers 23 (which do not serve as the references) in the exposure apparatus by rarely using the external illuminometer 24 makes it possible to minimize the calibration time of the internal illuminometer 23.

Moreover, the accuracy deterioration characteristic data of the internal illuminometer 23 is held in the apparatus to compensate for an accuracy deterioration in accordance with factors such as a temporal change and the number of integrated received light pulses. This allows the exposure amount error to always fall within the allowable value. Holding, in the apparatus, the sensitivity characteristic data of the internal illuminometer 23 to the exposure light reception angle also makes it possible to highly accurately convert the data of the internal illuminometer having an angular characteristic into the exposure amount.

Second Embodiment

The second embodiment of the present invention will be described below with reference to FIGS. 1 to 8. Note that the same reference numerals as those in the above embodiment denote the same or similar constituent parts, and a description thereof will be simplified or omitted hereinafter.

Figure 8:
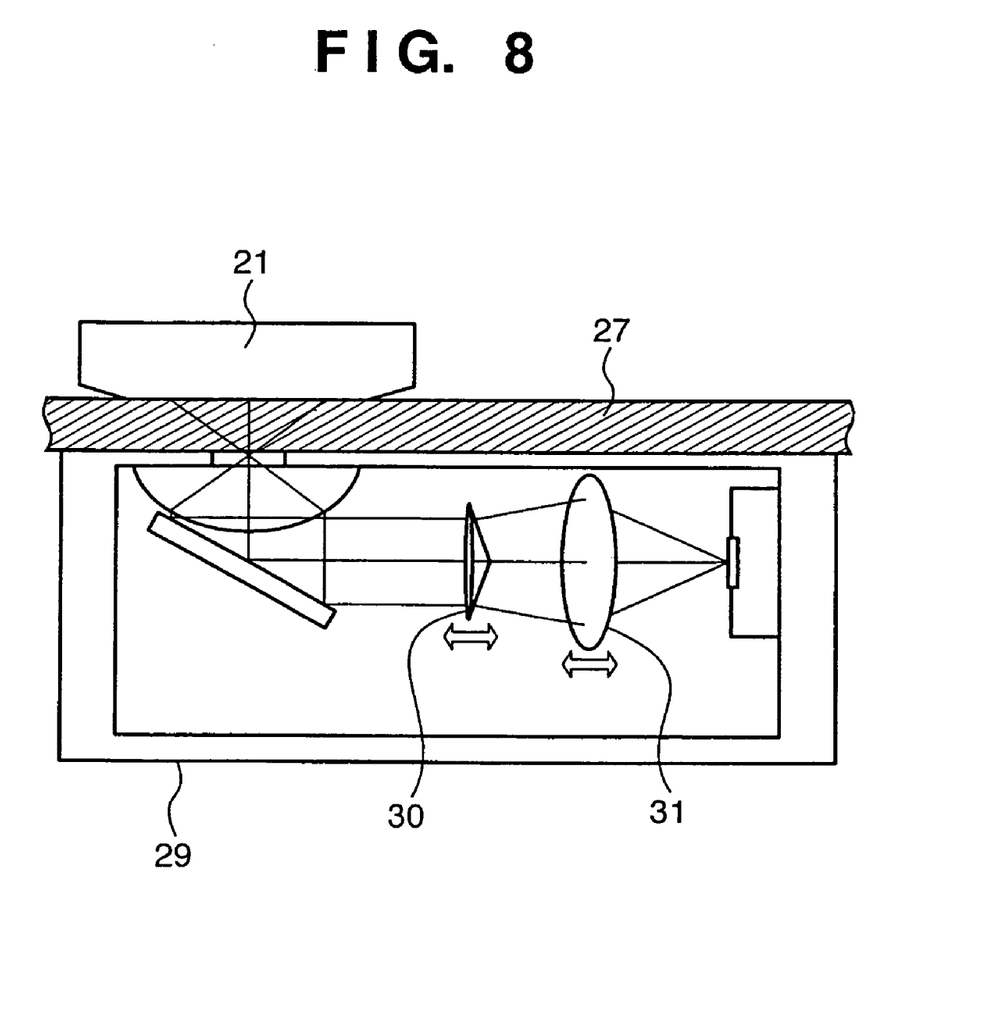
FIG. 8 is a view showing a light amount/incident angle adjustment mechanism of an internal illuminometer according to the second embodiment of the present invention.

In the first embodiment, since the internal illuminometer 23 has an angular characteristic, it is difficult to set the same NA of the projection lens both in the liquid immersion state and the dried state. In this case, calibration in consideration of the angular characteristic can be implemented as follows. As shown in FIG. 8, a movable prism 30 and zoom lens 31 are arranged on the optical path of an internal illuminometer 23 in a waterproof protection box 29. A mechanism which can change the incident angle of exposure light depending on the above positional relationship is formed to allow the exposure light to strike the internal illuminometer 23 at the same angle as the NA of the projection lens as in the dried state.

According to this embodiment, the angle of exposure light received by the internal illuminometer 23 is adjusted using the movable prism 30 and zoom lens 31 to highly accurately execute absolute light amount calibration in the liquid immersion state. Accuracy deterioration characteristic data of the internal illuminometer 23 is held in advance in the exposure apparatus to control an accuracy deterioration. Therefore, even when the projection optical system is used in the liquid immersion state, an exposure amount control performance with high accuracy as in a dried state can be attained.

[Device Manufacturing Method]

An embodiment of a device manufacturing method using the above-described exposure apparatus will be described next.

Figure 9:
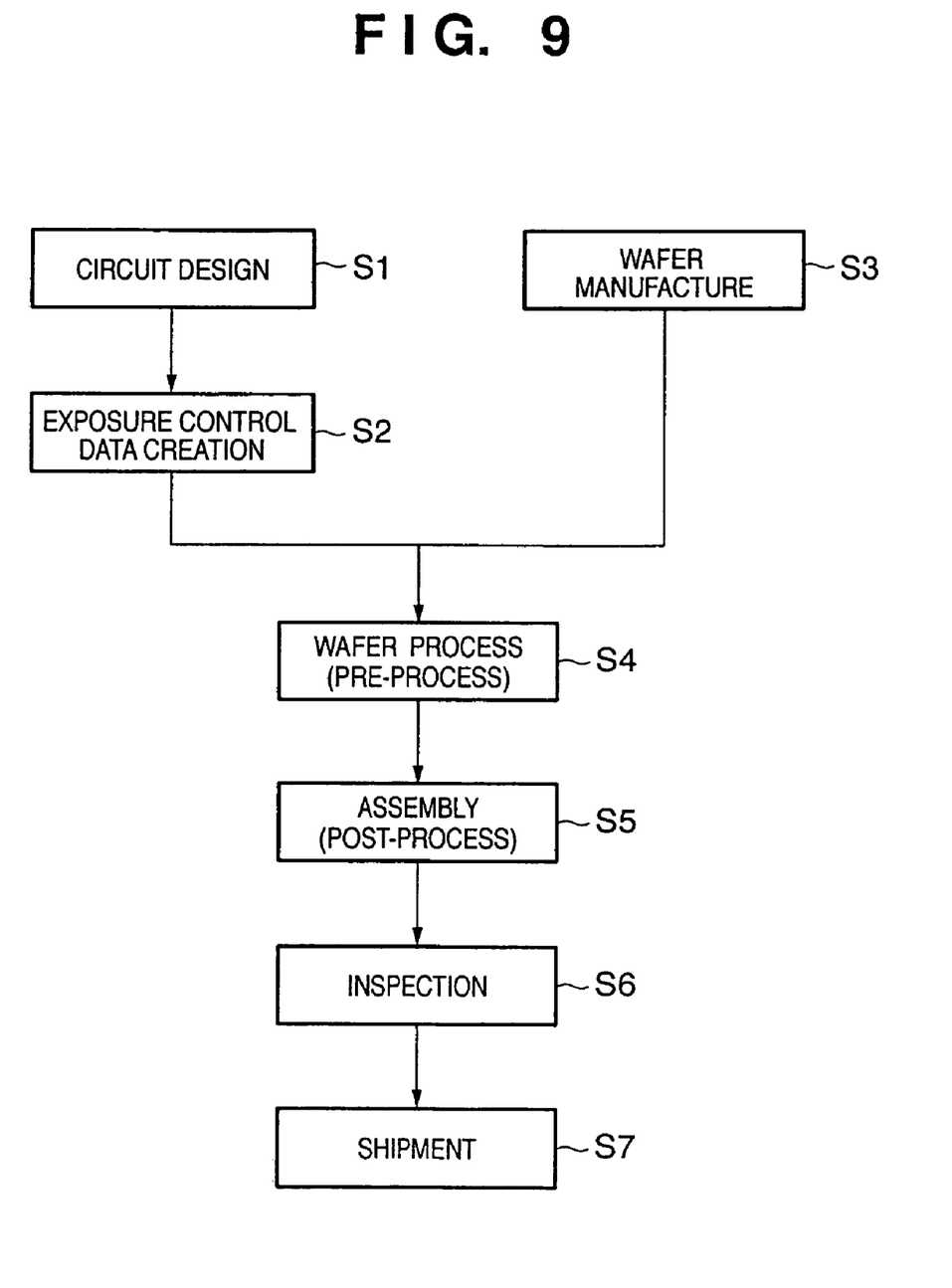
FIG. 9 is a flowchart for explaining the manufacturing flow of a microdevice.

FIG. 9 shows the flow of the manufacture of a microdevice (e.g., a semiconductor chip, such as an IC or LSI, a liquid crystal panel, a CCD, a thin-film magnetic head, or a micromachine). In step S1 (circuit design), the circuit of a semiconductor device is designed. In step S2 (exposure control data creation), exposure control data of the exposure apparatus is created on the basis of the designed circuit pattern. In step S3 (wafer manufacture), a wafer is manufactured using a material such as silicon. In step S4 (wafer process), called a pre-process, an actual circuit is formed on the wafer by lithography using the wafer and the exposure apparatus which has received the prepared exposure control data. Step S5 (assembly), called a post-process, is the step of forming a semiconductor chip by using the wafer manufactured in step S4. This step includes processes such as assembly (dicing and bonding) and packaging (chip encapsulation). In step S6 (inspection), the semiconductor device manufactured in step S5 undergoes inspections such as an operation confirmation test and a durability test. After these steps, the semiconductor device is completed and shipped (step S7).

Figure 10:
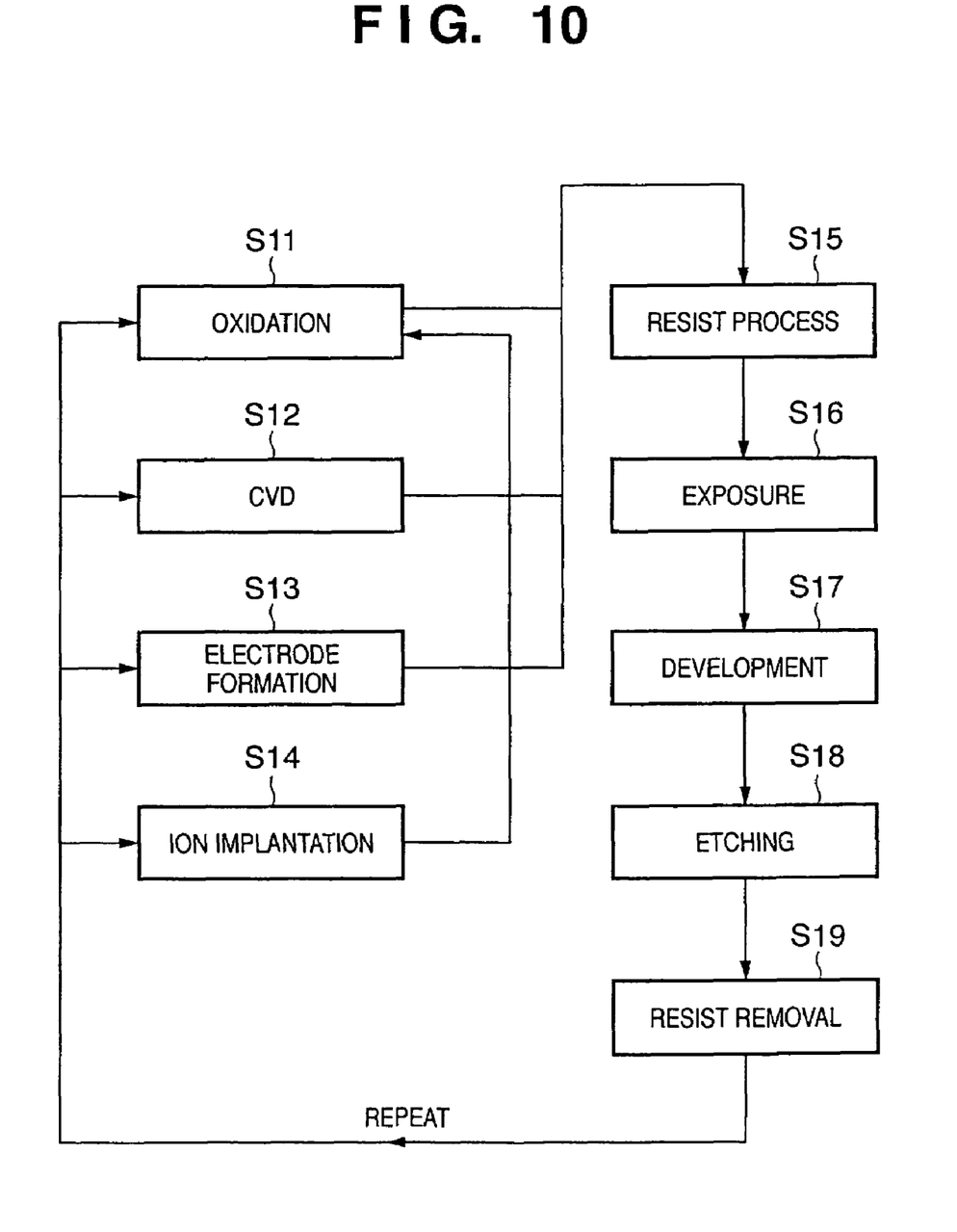
FIG. 10 is a flowchart for explaining the wafer process.

FIG. 10 shows the detailed flow of the wafer process. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted in the wafer. In step S15 (resist process), a photosensitive agent is applied to the wafer. In step S16 (exposure), the circuit pattern is printed on the wafer by exposure using the above-described exposure apparatus. In step S17 (development), the exposed wafer is developed. In step S18 (etching), portions other than the developed resist image are etched. In step S19 (resist removal), any unnecessary resist remaining after etching is removed. These steps are repeated to form multiple circuit patterns on the wafer.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for exposing a substrate to light via an original plate, the apparatus comprising:
   a projection optical system configured to project a pattern of the original plate onto the substrate;
   a liquid immersion mechanism configured to generate a liquid immersion state in which a gap between the final surface of the projection optical system and the substrate is filled with liquid;
   a first photosensor configured to detect light which has passed through the projection optical system;
   a second photosensor different from the first photosensor and configured to detect light that has passed through the projection optical system; and
   a controller configured to calibrate an output from the first photosensor in the liquid immersion state based on a first output from the first photosensor in the liquid immersion state, a second output from the first photosensor in a non-liquid immersion state, and a third output from a reference illuminometer for detecting light which has passed through the projection optical system in the non-liquid immersion state, and to calibrate an output from the second photosensor in the liquid immersion state based on the calibrated output from the first photosensor in the liquid immersion state and an output from the second photosensor in the liquid immersion state.

2. A method of manufacturing a device, the method comprising steps of:
   exposing a substrate to light via an original plate using the exposure apparatus as defined in claim 1;
   developing the exposed substrate; and
   processing the developed substrate to manufacture the device.

3. An exposure apparatus for exposing a substrate to light via an original plate, the apparatus comprising:
   a projection optical system configured to project a pattern of the original plate onto the substrate;
   a liquid immersion mechanism configured to generate a liquid immersion state in which a gap between the final surface of the projection optical system and the substrate is filled with liquid;
   a photosensor configured to detect light which has passed through the projection optical system; and
   a controller configured to calibrate an output from the photosensor in the liquid immersion state based on a first output from the photosensor in the liquid immersion state, a second output from the photosensor in a non-liquid immersion state, and a third output from a reference illuminometer for detecting light which has passed through the projection optical system in the non-liquid immersion state,
   wherein the photosensor includes an optical system configured to adjust a light exit angle therefrom in accordance with whether the photosensor is in a liquid immersion state.

4. A method of manufacturing a device, the method comprising steps of:
   exposing a substrate to light via an original plate using the exposure apparatus as defined in claim 3;
   developing the exposed substrate; and
   processing the developed substrate to manufacture the device.

5. An exposure apparatus for exposing a substrate to light via an original plate, the apparatus comprising:
   a projection optical system configured to project a pattern of the original plate onto the substrate;

a liquid immersion mechanism configured to generate a liquid immersion state in which a gap between the final surface of the projection optical system and the substrate is filled with liquid;

a photosensor configured to detect light which has passed through the projection optical system; and a controller configured to calibrate an output from the photosensor in the liquid immersion state based on a first output from the photosensor in the liquid immersion state, a second output from the photosensor in a non-liquid immersion state, and a third output from a reference illuminometer for detecting light which has passed through the projection optical system in the non-liquid immersion state, wherein the controller is configured to store characteristic data which represents a relationship between a numerical aperture of the projection optical system and a sensitivity of the photosensor, and to calibrate an output from the photosensor based on information of whether the photosensor is in a liquid immersion state, the numerical aperture, and the characteristic data.

6. The exposure apparatus according to claim 5, wherein the controller is configured to determine that the photosensor needs to be calibrated based on information about a use log of the photosensor.

7. A method of manufacturing a device, the method comprising steps of:
    exposing a substrate to light via an original plate using the exposure apparatus defined in claim 5;
    developing the exposed substrate; and
    processing the developed substrate to manufacture the device.

8. An exposure apparatus for exposing a substrate to light via an original plate, the apparatus comprising:
    a projection optical system configured to project a pattern of the original plate onto the substrate;
    a liquid immersion mechanism configured to generate a liquid immersion state in which a gap between the final surface of the projection optical system and the substrate is filled with liquid;
    a first photosensor configured to detect light which has passed through the projection optical system;
    a second photosensor configured to detect a part of light on an optical path between a light source and the projection optical system; and
    a controller configured to calibrate outputs from the first photosensor and the second photosensor in the liquid immersion state based on a first output from the first photosensor in the liquid immersion state, a second output from the first photosensor in a non-liquid immersion state, a third output from a reference illuminometer for detecting light which has passed through the projection optical system in the non-liquid immersion state, and to calibrate outputs from the first photosensor and the second photosensor in the liquid immersion state based on the first to third outputs, a fourth output from the second photosensor corresponding to the first output, a fifth output from the second photosensor corresponding to the second output, and a sixth output from the second photosensor corresponding to the third output.

9. A method of manufacturing a device, the method comprising steps of:
    exposing a substrate to light via an original plate using the exposure apparatus defined in claim 8;
    developing the exposed substrate; and
    processing the developed substrate to manufacture the device.

10. An exposure apparatus for exposing a substrate to light via an original plate, the apparatus comprising:
    a projection optical system configured to project a pattern of the original plate onto the substrate;
    a liquid immersion mechanism configured to generate a liquid immersion state in which a gap between the final surface of the projection optical system and the substrate is filled with liquid;
    a projection optical system photosensor configured to detect light which has passed through the projection optical system; and
    a controller configured to calibrate an output from the projection optical system photosensor in the liquid immersion state based on a first output from the projection optical system photosensor in one of the liquid immersion state and a non-liquid immersion state, a second output from a reference illuminometer for detecting light which has passed through the projection optical system in the non-liquid immersion state, and information of a transmittance of the liquid measured in advance.

11. The exposure apparatus according to claim 10, further comprising:
    an optical path photosensor configured to detect a part of light on an optical path between a light source and the projection optical system,
    wherein the controller is configured to calibrate outputs from the projection optical system photosensor and the optical path photosensor in the liquid immersion state based on the first and second outputs, a third output from the optical path photosensor corresponding to the first output, a fourth output from the optical path photosensor corresponding to the second output, and the transmittance information.

12. A method of manufacturing a device, the method comprising steps of:
    exposing a substrate to light via an original plate using the exposure apparatus defined in claim 10;
    developing the exposed substrate; and
    processing the developed substrate to manufacture the device.

13. A method applied to an exposure apparatus for exposing a substrate to light via an original plate, the apparatus including a projection optical system configured to project a pattern of the original onto the substrate, a liquid immersion mechanism configured to generate a liquid immersion state in which a gap between the final surface of the projection optical system and the substrate is filled with liquid, a first photosensor configured to detect light which has passed through the projection optical system, and a second photosensor configured to detect a part of light on an optical path between a light source and the projection optical system, the method comprising steps of:
    obtaining a first output from the first photosensor in the liquid immersion state;
    obtaining a second output from the first photosensor in a non-liquid immersion state;
    obtaining a third output from a reference illuminometer for detecting light which has passed through the projection optical system in a non-liquid immersion state;
    obtaining a fourth output from the second photosensor corresponding to the first output;
    obtaining a fifth output from the second photosensor corresponding to the second output;
    obtaining a sixth output from the second photosensor corresponding to the third output; and calibrating an output from each of the first photosensor and the second photosensor in the liquid immersion state based on the first through sixth outputs.

14. A method applied to an exposure apparatus for exposing a substrate to light via an original plate, the apparatus including a projection optical system configured to project a pattern of the original plate onto the substrate, a liquid immersion mechanism configured to generate a liquid immersion state in which a gap between the final surface of the projection optical system and the substrate is filled with liquid, and a projection optical system photosensor configured to detect light which has passed through the projection optical system, the method comprising steps of:

obtaining a first output from the projection optical system photosensor in one of the liquid immersion state and a non-liquid immersion state;

obtaining a second output from a reference illuminometer for detecting light which has passed through the projection optical system in the non-liquid immersion state; and calibrating an output from the projection optical system photosensor in the liquid immersion state based on the first and second outputs, and information of a transmittance of the liquid.

15. The method according to claim 14, wherein the apparatus includes an optical path photosensor configured to detect a part of light on an optical path between a light source and the projection optical system, the method further comprising steps of:

obtaining a third output from the optical path photosensor corresponding to the first output;

obtaining a fourth output from the optical path photosensor corresponding to the second output; and calibrating outputs from the projection optical system photosensor and the optical path photosensor in the liquid immersion state based on the first through fourth outputs and the transmittance information.

* * * * *